United States Patent
Adetutu et al.

[11] Patent Number: 6,136,678
[45] Date of Patent: Oct. 24, 2000

[54] METHOD OF PROCESSING A CONDUCTIVE LAYER AND FORMING A SEMICONDUCTOR DEVICE

[75] Inventors: Olubunmi Adetutu; James D. Hayden; Chitra Subramanian; Archana Redkar; Anthony Mark Miscione, all of Austin, Tex.; Mark G. Fernandes, San Jose, Calif.

[73] Assignee: Motorola, Inc., Schaumburg, Ill.

[21] Appl. No.: 09/033,422

[22] Filed: Mar. 2, 1998

[51] Int. Cl.[7] .................. H01L 21/3205; H01L 21/4763
[52] U.S. Cl. .............................. 438/592; 438/624
[58] Field of Search .................... 438/640, 624, 438/592, 96, 166, 182, 422; 257/522, 587

[56] References Cited

U.S. PATENT DOCUMENTS

| | | | |
|---|---|---|---|
| 4,030,789 | 6/1977 | Schampers et al. | 316/19 |
| 4,854,264 | 8/1989 | Noma et al. | 118/719 |
| 5,180,689 | 1/1993 | Liu et al. | 437/228 |
| 5,192,697 | 3/1993 | Leong | 437/37 |
| 5,324,683 | 6/1994 | Fitch et al. | 437/65 |
| 5,496,776 | 3/1996 | Chien et al. | 437/231 |
| 5,510,645 | 4/1996 | Fitch et al. | 257/522 |
| 5,541,444 | 7/1996 | Ohmi et al. | 257/587 |
| 5,582,640 | 12/1996 | Okada et al. | 117/8 |
| 5,597,422 | 1/1997 | Kataoka et al. | 437/211 |
| 5,605,609 | 2/1997 | Ando et al. | 204/192.23 |
| 5,772,862 | 6/1998 | Ando et al. | 204/298.13 |
| 5,854,097 | 12/1998 | Ohmi et al. | 438/182 |
| 5,879,447 | 3/1999 | Okada et al. | 117/8 |
| 6,030,893 | 2/2000 | Lo et al. | 438/652 |

*Primary Examiner*—John F. Niebling
*Assistant Examiner*—Walter L. Lindsay, Jr.
*Attorney, Agent, or Firm*—Jeffrey S. Abel; Robert A. Rodriquez

[57] ABSTRACT

A method for processing a conductive layer, such as a doped polysilicon layer (14) of a gate stack, provides a degas step after precleaning to reduce particle count and defectivity. The conductive layer is provided on a substrate (10), e.g., a silicon wafer. The substrate (10) and conductive layer are subjected to an elevated temperature, under a vacuum, whereby certain species are liberated. The substrate having the conductive layer formed thereon is then removed from the chamber, and moved to a second, separate chamber, in which a second conductive layer (20) is deposited. By switching chambers, the liberated species are largely prevented from contributing to particle count at the interface between the conductive layers. Alternatively, the second conductive layer is formed in the same chamber, provided that the liberated species are removed from the chamber prior to deposition of the second conductive layer.

13 Claims, 1 Drawing Sheet

METHOD OF PROCESSING A CONDUCTIVE LAYER AND FORMING A SEMICONDUCTOR DEVICE

FIELD OF THE INVENTION

The present invention is drawn in general to a novel transistor structure for very large scale integration (VLSI), and more particularly, to a novel method of forming a gate stack of a transistor with low defectivity and increased yield.

BACKGROUND OF THE INVENTION

With feature sizes in very large scale integration (VLSI) shrinking well below the micron level, reduction in resistivity of conducting layers throughout the integrated structure has become increasingly important. One particular layer that has been incorporated in gate stacks of transistors in, for example, static random access memory (SRAM) cells and dynamic random access memory (DRAM) cells is a refractory metal silicide, such as tungsten silicide ($WSi_x$). Such refractory metal silicides are effective to reduce the sheet resistance of the doped polysilicon layer that is incorporated in the gate, since the metal silicides have a lower resistivity than the polysilicon layer. While silicides of titanium (Ti), tungsten (W), tantalum (Ta), molybdenum (Mo), cobalt (Co), etc. have been utilized, nitrides of such refractory metals may also be utilized.

Because the refractory metal silicide is generally formed directly on the polysilicon layer of the gate stack, a pre-clean step is usually carried out to improve adhesion between the deposited material and the polysilicon layer and to reduce particle count (thus decreasing defectivity) at the interface. For example, the polysilicon may be pre-cleaned with an HF treatment, followed by rinsing with isopropol alcohol. The pre-clean step is generally considered effective to remove the native oxide that forms on the polysilicon, as well as any screen oxide thereon. However, the present inventors have recognized a need in the art to improve further the yield of such devices. Particularly, the present inventors have focused on defectivity caused by particles present at the interface between the deposited conductive layer and the polysilicon layer.

BRIEF DESCRIPTION OF THE DRAWINGS

FIGS. 1–4 illustrate various stages in the process of forming a transistor structure, particularly, a gate stack, according to an embodiment of the present invention, wherein:

FIG. 1 illustrates a stage in the process wherein a screen oxide is formed over a deposited polysilicon layer;

FIG. 2 illustrates a further stage in the process, wherein the screen oxide and any native oxide on the polysilicon layer are removed by a pre-cleaning step, followed by particular pretreatment steps discussed in more detail below;

FIG. 3 illustrates still a further stage of the completed gate stack prior to patterning; and FIG. 4 illustrates the gate stack after patterning, and formation of source and drain regions.

Figure 1:
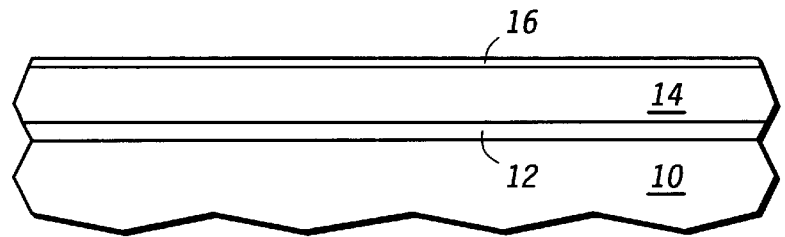

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

As used herein, the term conductive refers to a resistivity below approximately 0.01 ohm cm. As noted above in the background, both the doped polysilicon layer and the layer formed thereon are both conductive. However, the layer deposited on the polysilicon layer has a lower resistivity than the doped polysilicon layer.

Turning to FIG. 1, one stage in the process of forming a semiconductor device according to the present invention is illustrated. A semiconductor substrate 10 is provided, upon which several layers are formed. Substrate 10 may be formed of any one of known semiconductor materials, including doped or undoped silicon, germanium, gallium, silicon on insulator (SOI), epitaxially grown silicon, etc. A gate dielectric layer 12 (10 to 200 Å) is then thermally grown on substrate 10. The gate dielectric layer may be silicon dioxide, formed thermally in wet, partially wet, or dry environments. In addition, the gate dielectric may be replaced with other materials, such as silicon nitride, among others. Such other materials have recently been investigated for improved dielectric properties. Then, a polysilicon layer 14 (500 to 2000 Å) is deposited to overlie the gate oxide layer 12. Although a single polysilicon layer 14 is shown, as is understood in the art, several polysilicon layers (e.g., two layers) may be deposited, such as by low pressure chemical vapor deposition (LPCVD). Thereafter, a screen oxide layer 16 is thermally grown on the polysilicon layer 14, followed by doping of the polysilicon layer to increase its conductivity with an appropriate dopant, such as arsenic (As), boron (B), or phosphorus (P).

Figure 2:
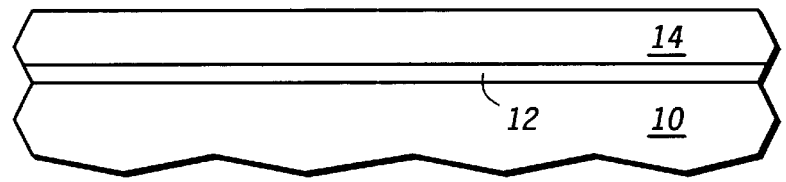

Turning to FIG. 2, the screen oxide layer 16 is removed by a pre-cleaning step in which the screen oxide layer 16 is subjected to an acidic solution, such as HF, in vapor form or liquid form. HF is effective to remove the oxide, as well as any native oxide formed on the polysilicon layer 14, below the screen oxide layer 16. The screen oxide layer has a thickness on the order of 100 Å and the pre-clean is targeted to remove up to approximately 400 Å of oxide to ensure complete removal of all oxide material.

As noted above, the pre-cleaning step to remove the oxide is generally effective to provide a good surface on which a later deposited conductive layer, a metal containing layer such as a metal silicide or metal nitride), is formed. While the pre-cleaning step is also intended to reduce defectivity by reducing particle count at the interface between the deposited conductive layer and the polysilicon layer, it has been found by the present inventors that further improvement in particle reduction is desirable.

Accordingly, in an embodiment of the present invention, following the pre-cleaning step, the gate stack is subjected to a degassing treatment. This degassing treatment takes place in a degassing chamber at an elevated temperature, such as on the order of 300–500° C., preferably 380–420° C., more preferably about 400° C. The use of a particular degassing chamber is not uniquely important, although a commercially available degassing chamber supplied by Applied Materials was used in one embodiment. According to an embodiment of the present invention, the degassing step takes place in a vacuum at a pressure lower than $10^{-4}$ torr, preferably lower than $10^{-5}$ torr, such as between $10^{-7}$ to $10^{-8}$ torr. The gate stack is subjected to the elevated temperature for relatively short duration, but preferably, greater than 20 seconds, more preferably, 30–80 seconds. The short heating duration may be achieved by utilizing a radiation source, for example, from a tungsten-halogen heating lamp, by directly irradiating the polysilicon layer.

During the degassing treatment, it was observed that certain species were liberated (out-gassed), the liberated species including hydrogen and water vapor. Moreover, it was found that the degassing treatment was effective to liberate or degas the dopant (in one embodiment, arsenic) from the polysilicon layer. The amount of degassing of the dopant is not so great so as to affect the conductivity of the polysilicon layer. In this regard, it is believed that in the prior art, the out-gassed materials contribute to increased particle count. Particularly, it is believed that the out-gassed components, including the dopant, contribute to gas phase nucleation and a growth of particles at the interface, during deposition of the conductive layer on the polysilicon layer.

Accordingly, in one embodiment of the present invention, the semiconductor structure is removed from the degassing chamber in which degassing takes place, and placed into a separate and distinct chamber in which the conductive layer (e.g., silicides or nitrides of tungsten (W), tantalum (Ta), titanium (Ti), molybdenum (Mo), cobalt(Co), and vanadium (Va)) is deposited, thus preventing formation of particles. In this way, the liberated species in gaseous form cannot contribute to gas phase nucleation and growth, thereby restricting growth of particles during deposition. Alternatively, degassing may be carried out in the same chamber in which the conductive layer is deposited, provided that the out-gassed components are removed from the chamber prior to deposition. For example, the outer walls of the deposition chamber may be heated to a higher temperature than the ambient therein, during the degassing step to prevent deposition (condensation) of hydrogen, $H_2O$ and arsenic along the chamber walls. In this embodiment, vacuum at a low pressure as noted above should be maintained, to evacuate the degassed components from the chamber.

It was also found that the degassing treatment at the abovestated elevated temperature aids in annealing the polysilicon layer, which has a damaged crystal structure due to the implant of dopant, as described above.

Figure 3:
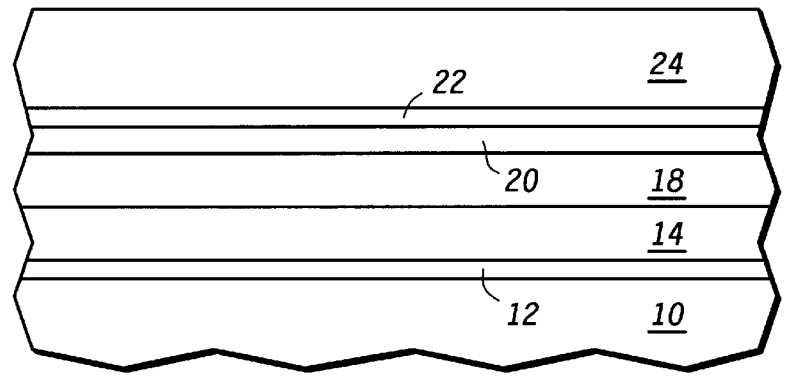

Following the degassing treatment, the semiconductor structure is placed in a second, separate chamber for chemical vapor deposition (CVD) of the conductive layer. As illustrated in FIG. 3, a 500–1000 Å tungsten silicide ($WSi_x$) layer 18 is deposited on the treated polysilicon layer 14, by LPCVD. The tungsten silicide layer 18 is deposited at approximately 450° C., at a pressure of 0.6 torr. The improvement in reduction of particles was realized even when the wafer being processed was exposed to ambient, during the transfer from the first chamber to the second chamber. However, preferably, both chambers are provided in a isolated, hermetically sealed environment to supress further particle formation.

Following deposition of tungsten silicide layer 18, a glue layer 20 is formed, to improve adhesion between an antireflective coating (ARC) layer 22 and the tungsten silicide layer 18. The glue layer is on the order of 300 Å in thickness, and is formed of amorphous Si as in known in the art. The ARC layer 22 is approximately 200 Å thickness, and is formed of silicon-rich silicon nitride. The layers of the gate stack are completed by forming a silicon nitride cap layer 24, on the order of 1000 Å in thickness.

Figure 4:
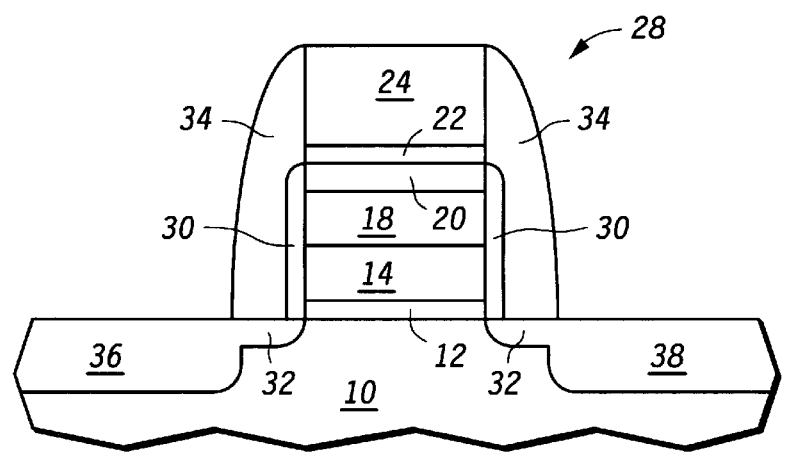

Turning to FIG. 4, the gate stack is patterned and etched to form a gate electrode 28. Gate electrode 28 is subjected to a reoxidation treatment to form reoxidation regions 30, as is known in the art. Following formation of reoxidation regions 30, the substrate is subjected to a light doping treatment to form lightly doped drains (LDDs) 32. Then, silicon nitride sidewall spacers 34 are formed according to conventional techniques, followed by source/drain (S/D) implants to form source region 36 and drain region 38. At this point, processing of the semiconductor device is continued up to passivation by forming appropriate interlevel dielectric layers, contacts, plugs, and interconnecting metal layers between the interlevel dielectric layers, as known in the art. The transistor structure according to the present invention may be used to form SRAM cells or DRAM cells, for example.

According to the present invention, a very significant improvement in defectivity by reducing particle count has been realized. The present inventors have increased quite significantly the average yield of good die per wafer. In one run, the present invention provided an average yield of 71%. In direct contrast, a conventional process utilizing no degas step provided an average yield of 25% good die per wafer. Accordingly, it is quite clear that the present invention provides a significant improvement in yield of good die by reducing particle count and defectivity in the gate stack.

While the present invention has been described herein with particular detail with respect to embodiments of the present invention, it is well understood that one of ordinary skill in the art may modify the present invention without departing from the spirit and scope of the claims attached herein.

What is claimed is:

1. A method of forming a semiconductor device, comprising the steps of:

providing a substrate;

forming a gate dielectric on said substrate;

forming a conductive layer overlying said gate dielectric, said conductive layer comprising doped polysilicon;

pre-cleaning said conductive layer to remove oxide on said conductive layer;

heating said conductive layer in a first chamber for a predetermined amount of time under a vacuum, said heating step producing a liberated species;

placing said conductive layer in a second chamber, separate from the first chamber, to form a second conductive layer on said conductive layer;

forming an antireflective coating layer on said second conductive layer; and patterning said gate dielectric, conductive layer, second conductive layer and antireflective coating layer to form a gate electrode.

2. The method of claim 1, wherein said vacuum is less than $10^{-4}$ torr.

3. The method of claim 1, wherein said step of pre-cleaning said conductive layer further comprises the steps of:

subjecting said conductive layer to an acidic solution to remove said oxide layer;

rinsing said acidic solution from said conductive layer; and drying said conductive layer.

4. The method of claim 3, wherein said acidic solution comprises HF.

5. The method of claim 1, wherein said predetermined amount of time is at least 20 seconds.

6. The method of claim 1, wherein the doped polysilicon layer is doped with arsenic.

7. The method of claim 1, wherein said liberated species comprises at least one component from a group consisting of arsenic, water vapor, and hydrogen.

8. The method of claim 1, wherein said second conductive layer is a material selected from the group consisting of tungsten, tantalum, titanium, molybdenum, vanadium, cobalt, a silicide thereof, and a nitride thereof.

9. The method of claim 8, wherein said second conductive layer is a refractory metal silicide.

10. The method of claim 9, wherein the refractory metal silicide comprises tungsten silicide.

11. The method of claim 1, wherein said step heating said conductive layer further comprises a step of heating said conductive layer using a radiation source.

12. The method of claim 1, wherein the radiation source comprises a heating lamp that irradiates said conductive layer directly.

13. The method of claim 1, wherein said conductive layer is heated in the first chamber at a temperature in a range of about 300 to 500° C.

* * * * *